United States Patent [19]

Min et al.

[11] Patent Number: 5,034,625

[45] Date of Patent: Jul. 23, 1991

[54] SEMICONDUCTOR SUBSTRATE BIAS CIRCUIT

[75] Inventors: Dong-sun Min, Seoul; Hoon Choi, Taegu, both of Rep. of Korea

[73] Assignee: Samsung Electronics Co., Ltd., Rep. of Korea

[21] Appl. No.: 417,314

[22] Filed: Oct. 5, 1989

[30] Foreign Application Priority Data

Dec. 19, 1988 [KR] Rep. of Korea .................... 88-16959

[51] Int. Cl.[5] ...................... H03K 3/354; H01L 19/00; H01L 27/04; H01L 29/94

[52] U.S. Cl. .............................. 307/296.2; 307/296.1; 307/304

[58] Field of Search .................. 307/296.2, 304, 296.1, 307/296.8

[56] References Cited

U.S. PATENT DOCUMENTS 4,336,466 6/1982 Sud et al. ......................... 307/296.2

4,439,692 3/1984 Beekmans et al. ............... 307/296.2

4,794,278 12/1988 Vajdic ............................. 307/296.2

*Primary Examiner*—Stanley D. Miller

*Assistant Examiner*—David R. Bertelson

*Attorney, Agent, or Firm*—Cushman, Darby & Cushman

[57] ABSTRACT

A semiconductor substrate bias circuit is disclosed which comprises: first and second substrate biasing means connected in parallel between the substrate and a ground node, for pumping the charges from said substrate to said ground node or in the reverse direction in order to bias said substrate; and a detecting means for selectively enabling said first and second substrate biasing means in accordance with the levels of the substrate bias voltage. The circuit of the present invention is capable of supplying adequate bias voltages depending on the various operating modes, reducing the standby current loss at a standby state, and is suitable for being installed on a VLSI semiconductor chip.

16 Claims, 2 Drawing Sheets

SEMICONDUCTOR SUBSTRATE BIAS CIRCUIT

FIELD OF THE INVENTION

The present invention relates to a semiconductor substrate bias circuit, and particularly to a circuit for generating a stable substrate bias voltage on a high density semiconductor device.

BACKGROUND OF THE INVENTION

Generally MOS circuits are provided with a substrate bias circuit because of the advantage obtainable from the substrate bias voltage. That is, if a negative VBB voltage is applied to the substrate of an NMOS LS1 or VLSI chip, then the sensitivity of the threshold voltage due to the body effect can be lowered, the punch-through voltage can be increased, and the ratio between the diffusion and the capacitance of the substrate can be lowered without reduction of the doping of the substrate. Further, the subthreshold leakage for a clocked depletion transistor can be reduced, and the chip can be protected from the forward biasing. Here, the forward biasing of the substrate is indicative of a voltage undershoot generated at an input terminal commonly shared by the TTL peripheral circuits. (Refer to "The Design and Analysis of VLST Circuits;" Lance A. Glasser and Daniel W. Dobberpuhl, 1985.)

The usual substrate bias circuits generating a negative bias voltage emits AC signals having a required frequency through an oscillator, and these AC signals are amplified by means of a driver. Further, the AC signals amplified by the driver are supplied to a charge pump. Therefore, the charge pump pumps the charges from the substrate to a ground node, so that the substrate should become negatively biased.

However, there arises a problem when a substrate bias circuit is installed in a semiconductor chip, the problem being such that the substrate bias circuit has to be constantly driven even in a waiting state of the semiconductor chip, and therefore, the standby current is increased. Further, if the substrate bias circuit is varied due to a noise or due to a variation of the power source, then the various electric parameters of the semiconductor device are also varied.

Further, according as the density of a semiconductor chip is increased, two or more substrate bias circuits are provided in a single chip in order to supply a stable substrate bias voltage. However, in such a case, the standby current can be increased to a greater extent.

SUMMARY OF THE INVENTION

Therefore, the present invention is intended to overcome the disadvantages of the conventional techniques as described above.

Therefore, it is an object of the present invention to provide a semiconductor substrate bias circuit capable of supplying adequate bias voltages depending on the various operating modes by arranging that two or more bias voltage generating means should become selectively operable in accordance with the substrate bias voltage level.

It is another object of the present invention to provide a semiconductor substrate bias circuit capable of reducing the standby current loss at a standby state.

It is still another object of the present invention to provide a semiconductor substrate bias circuit which is suitable for being installed on a VLSI semiconductor chip.

In achieving the above object, the circuit according to the present invention comprises; first and second substrate biasing means which are connected in parallel each other between the substrate and a ground node, and are for biasing the substrate during an enabled state by pumping the charge from the substrate to the ground node or in the reverse direction; and a detecting means for selectively enabling the first and the second substrate biasing means according to the substrate bias voltage level.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENTS

Figure 1:
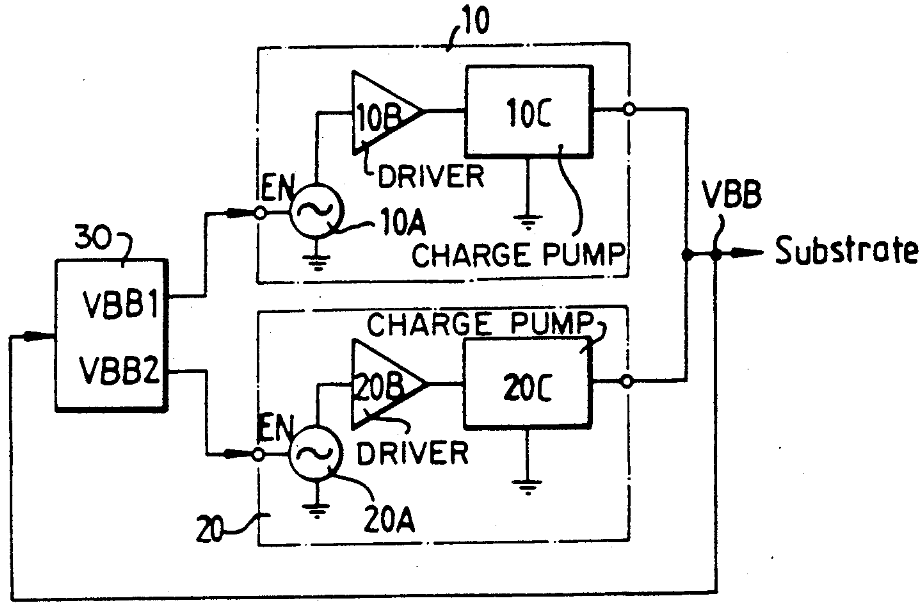
FIG. 1 is a block diagram of the substrate bias circuit according to an embodiment of the present invention.

FIG. 1 illustrates a block diagram of the substrate bias circuit according to an embodiment of the present invention. In FIG. 1, substrate biasing means 10,20 are provided with oscillators 10A, 20A, with drivers 10B,20B, and with charge pumps 10C, 20C respectively.

The oscillators 10A, 20A are usually provided in two types so as for them to be fit to the substrate bias pumps. One of them is ring oscillator which consists of N' steps, where N is an odd number and is larger than 5. If these conditions are not met, the voltage oscillation can be extremely small.

Another one is Schmitt trigger in which an RC filter is stored within the loop, and which can be used in place of the ring oscillator. In practice, the frequency of the oscillator is fitted to the clock of the system. According to an embodiment of the present invention, the oscillators 10A, 20A are respectively provided with an enable terminal, and are enabled by means of enable signals supplied from a detecting means 30 which will be described later.

The drivers 10B, 20B amplify the oscillating power of the oscillators 10A, 20A to a proper level to suppy the outputs of them to the charge pumps 10C, 20C which are to be described later.

In the case where the substrate is a P type, the charge pumps 10C, 20C pump the charges from the substrate to a ground node in order to bias the substrate to a negative voltage. The charge pumps are usually respectively provided with; two diodes interconnected in series between the substrate and the ground node in the forward direction; and a coupling capacitor connected between the driver and the common connection point of the diodes.

Accordingly, during the negative half period of the driving signal inputted through the coupling capacitor, the diode connected between the substrate and the common connecting point is turned on so as for the charges of the substrate to be charged to the coupling capacitor, while, during the following positive half period, the diode connected between the common connecting point and the ground node is turned on so as for the charges into the coupling capacitor to be discharged to the ground. Thus, through the repetition of the above described operation, the charges are pumped from the substrate to the ground node, so that the substrate should be biased to a negative voltage.

If the above described diode is an ideal one, the average current flowing from the substrate to the ground will be $Iav=\Delta V \cdot C \cdot f$, where $\Delta V$ represents the difference of voltage between the actual substrate voltage and the optimum theoretical substrate voltage, C represents the capacity of the capacitor, and f represents the frequency of the driving signals.

If the value of $\Delta V$ is large, that is, when the pump is initially operated, it can be recognized that the current value is very large. The pump should be operable at all the values of the substrate voltages between 0 and the optimum voltage.

The detecting means 30 detects whether the level of the substrate bias voltage corresponds to the preset level, and outputs the detected results to enable signal output terminals VBB1, VBB2 which are connected respectively to the enable input terminals of the oscillators 10A, 20A.

According to the present invention, during the initial power source connecting stage, or in the region where the variations of the substrate voltage are large and speedy as in the active cycles of the semiconductor and the restoration of the voltage level is needed, the first and second substrate biasing means 10, 20 are made to be operated simultaneously. Under a state where the variations of the substrate voltage are small as in the standby state, only a single substrate biasing means is let to be operated, while, at a state with a voltage above a stabilized substrate voltage, the both substrate biasing means 10, 20 are disabled. That is, the states of the output signals of the detecting means 30 are set as shown in Table 1 below.

TABLE 1

| \|−VBB\| | 0 | VBB1 | VBB2 |
|---|---|---|---|
| First substrate biasing means | Enable | Enable | Disable |
| Second substrate biasing means | Enable | Disable | Disable |

That is, if the substrate bias voltage |−VBB| comes between 0 and the first set level VBB1, then the first and second substrate biasing means 10, 20 are simultaneously enabled. If the substrate bias voltage comes between the first set level VBB1 and the second set level VBB2, then the first substrate biasing means 10 is enabled, and the second substrate biasing means 20 is disabled. If the substrate bias voltage is higher than the second set level, then the first and second substrate biasing means 10, 20 are both disabled.

Figure 2:
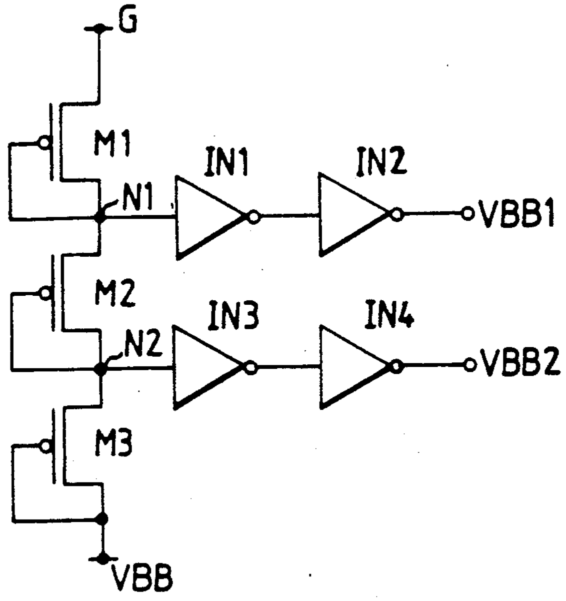
FIG. 2 is a circuital illustration of the detecting means of FIG. 1.

FIG. 2 illustrates an embodiment of the detecting means according to the present invention. In this drawings, the detecting means includes three PMOS transistors M1, M2, M3 interconnected in series between the substrate and the ground node, their drains and gates beings connected each other. Further, the common connection points N1, N2 for the PMOS transistors are respectively connected through serially connected (in two steps) inverters IN1, IN2 and IN3, IN4 to the output terminals VBB1, VBB2. The PMOS transistors M1, M2, M3 having the above-mentioned drains and gates divide substrate voltages VBB, so that the divided voltages should appear at their common connection points N1, N2 in accordance with the variations of the substrate voltages. The divided voltages are outputted in the from of logic stages "0" or "1" through the serially connected (in two steps) inverters IN1, IN2 and In3, IN4 in order to be supplied as enabled signals.

Here, the common connection point voltages VN1, VN2 can be set to arbitrary values by varying the size of the PMOS transistors, while it is also possible to set a proper common connection point voltage by increasing the connected number of the PMOS transistors.

Further, the detecting level of the detecting means 30 can be set by differently setting the logic threshold voltage for the inverters through the variation of the size of elements. The means for dividing the substrage voltage of the detecting 30 consists of a diffusion resistance or an ion implantation resistance, and the detecting level can be set by varying the resistance value. The above mentioned substrate voltage dividing means can be separately provided correspondingly with the different voltages to be divided.

Figure 3:
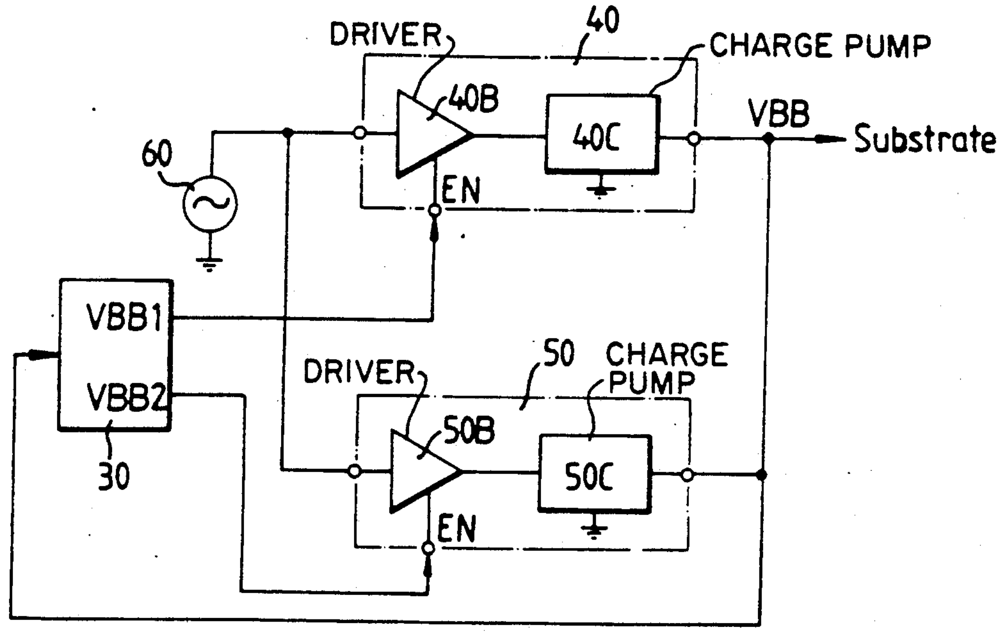
FIG. 3 is a block diagram of the substrate bias circuit according to another embodiment of the present invention.

FIG. 3 is a block diagram of the circuit according to another embodiment of the present invention. In this drawing, first and second substrate biasing means 40, 50 receive the oscillating signals commonly from a signals oscillator 60, while respective drivers 40B, 50B receive enable signals from a detecting means 30.

Reference codes 40C and 50C indicate charge pumps.

Thus according to the present invention suing a semiconductor device provided with two or more substrate biasing means, the substrate biasing means can be selectively operated in accordance with the levels of the substrate bias voltage, so that bias voltages suitable to different operating modes can be supplied. Therefore, under an operation mode requiring a large substrate pumping current, the two substrate biasing means are simultaneously activated in order to attain to the optimum bias voltage within a short period of time, while, under a standby mode, only one of the substrate biasing means is enabled so as for the standby current to be reduced. Accordingly, a more stable substrate bias voltage can be supplied.

In the above embodiments of the present invention, descriptions were made based on P type substrates, but if an N type substrate is to be used, a positive bias voltage has to be supplied, and proper design alterations will be required. For example, the connection for the charge pumps should be carried out in the reverse direction.

Further, according to the embodiments of the present invention, the setting of levels were described based on the assumption that PMOS transistors were used, while it is a matter of fact that NMOS or depletion type MOS transistors can be used by connecting them in the form of "transistor diodes".

What is claimed is:

1. A semiconductor substrate bias circuit comprising:

first and second substrate biasing means, connected in parallel between a substrate and a ground node, for biasing said substrate with a substrate bias voltage; and detecting means for selectively enabling said first and second substrate biasing means in accordance with the substrate bias voltage.

2. The semiconductor substrate bias circuit as claimed in claim 1, wherein said substrate is a P type semiconductor substrate, and said first and second substrate biasing means bias said substrate with a negative voltage.

3. The semiconductor substrate bias circuit as claimed in claim 2, wherein each of said first and second substrate biasing means comprises:

an oscillator for outputting oscillating signals of a certain frequency in accordance with externally supplied signals;

a driver for amplifying the outputs of said oscillator; and a charge pump for pumping charges from said substrate to said ground node in accordance with the output signals amplified by said driver.

4. The semiconductor substrate bias circuit as claimed in claim 3, wherein said detecting means comprises two output terminals which are connected to corresponding enable terminals of said respective oscillators of said first and second substrate biasing means; whereby, if the substrate bias voltage is between 0 V and a first set level, said detecting means enables both said first and second substrate biasing means; if the substrate bias voltage is between said first set level and a second set level, said detecting means enables one of said first and second substrate biasing means and disables the other one of said first and second substrate biasing means; and if the substrate bias voltage exceeds said second set level, said detecting means disables both said first and second substrate biasing means.

5. A semiconductor substrate bias circuit as claimed in claim 4, wherein the first set level is less than the second set level.

6. The semiconductor substrate bias circuit as claimed in claim 5, wherein said detecting means is provided with voltage dividing means for generating two different divided voltages by dividing the substrate bias voltage.

7. The semiconductor substrate bias circuit as claimed in claim 6, wherein said voltage dividing means is interconnected in series between said substrate and said ground node, and is provided with at least three PMOS transistors, the gates and drains of which are connected to each other.

8. The semiconductor substrate bias circuit as claimed in claim 7, wherein said two different divided voltages are determined by sizes of said PMOS transistors.

9. The semiconductor substrate bias circuit as claimed in claim 7, wherein said two different divided voltages are determined by the connected number of said PMOS transistors.

10. The semiconductor substrate bias circuit as claimed in claim 6, wherein said voltage dividing means comprises diffusion resistances interconnected in series between said substrate and said ground node.

11. The semiconductor substrate bias circuit as claimed in claim 10, wherein said two different divided voltages are determined by a magnitude of a surface resistance of said diffusion resistance.

12. The semiconductor substrate bias circuit as claimed in any one of claims 6, 7, 8, 9, 10 or 11, wherein the divided voltages of said voltage dividing means are supplied to said output terminals of said detecting means through one or more inverters having a certain logic threshold voltage.

13. The semiconductor substrate bias circuit as claimed in claim 12, wherein said set first and second levels are determined by varying the logic threshold voltage of said inverter.

14. The semiconductor substrate bias circuit as claimed in claim 2, wherein said first and second substrate biasing means are commonly coupled to an oscillator, and each of said first and second substrate biasing means further comprises:

a driver for amplifying outputs of said oscillator, and a charge pump for pumping charges from said substrate to said ground node in accordance with the output signals amplified by said driver.

15. A semiconductor substrate bias circuit comprising:

first and second substrate biasing means, connected in parallel between a substrate and a ground node, for biasing said substrate with a substrate bias voltage; and detecting means for selectively enabling said first and second substrate biasing means in accordance with the substrate bias voltage;

said detecting means enabling both said first and second substrate biasing means when the substrate bias voltage is between 0 V and a first set level;

said detecting means enabling one of said first and second substrate biasing means and disabling the other one of said first and second substrate biasing means when the substrate bias voltage level is between said first set level and a second set level; and said detecting means disabling both said first and second substrate biasing means when the substrate bias voltage exceeds said second set level.

16. A semiconductor substrate bias circuit comprising:

a plurality of substrate biasing means, connected in parallel between a substrate and a ground node, for biasing said substrate with a substrate bias voltage; and detecting means for selectively enabling different ones of said plurality of substrate biasing means in accordance with the substrate bias voltage.

* * * * *

US005034625A

REEXAMINATION CERTIFICATE (1983rd)

United States Patent [19]

[11] B1 5,034,625

Min et al.

[45] Certificate Issued Apr. 20, 1993

[54] SEMICONDUCTOR SUBSTRATE BIAS CIRCUIT

[75] Inventors: Dong-sun Min, Seoul; Hoon Choi, Taegu, both of Rep. of Korea

[73] Assignee: Samsung Electronics Co., Ltd., Suwon, Rep. of Korea

Reexamination Request:
No. 90/002,594, Feb. 14, 1992

Reexamination Certificate for:

| | |
|---|---|
| Patent No.: | 5,034,625 |
| Issued: | Jul. 23, 1991 |
| Appl. No.: | 417,314 |
| Filed: | Oct. 5, 1989 |

[30] Foreign Application Priority Data

Dec. 19, 1988 [KR] Rep. of Korea .................... 88-16959

[51] Int. Cl.[5] ...................... H03K 3/354; H01L 27/04; H01L 29/94

[52] U.S. Cl. .............................. 307/296.2; 307/296.2; 307/304

[58] Field of Search ............... 307/296.1, 296.2, 296.3, 307/296.8, 304; 323/315; 365/189.09

[56] References Cited

U.S. PATENT DOCUMENTS

| | | | |
|---|---|---|---|
| 4,142,114 | 2/1979 | Green | 307/304 |
| 4,430,581 | 2/1984 | Mogi et al. | 307/296.2 |
| 4,775,959 | 10/1988 | Sato et al. | 365/189.09 |
| 4,961,007 | 10/1990 | Kumanoya et al. | 307/296.2 |

*Primary Examiner*—John Zazworsky

[57] ABSTRACT

A semiconductor substrate bias circuit is disclosed which comprises: first and second substrate biasing means connected in parallel between the substrate and a ground node, for pumping the charges from said substrate to said ground node or in the reverse direction in order to bias said substrate; and a detecting means for selectively enabling said first and second substrate biasing means in accordance with the levels of the substrate bias voltage. The circuit of the present invention is capable of supplying adequate bias voltages depending on the various operating modes, reducing the standby current loss at a standby state, and is suitable for being installed on a VLSI semiconductor chip.

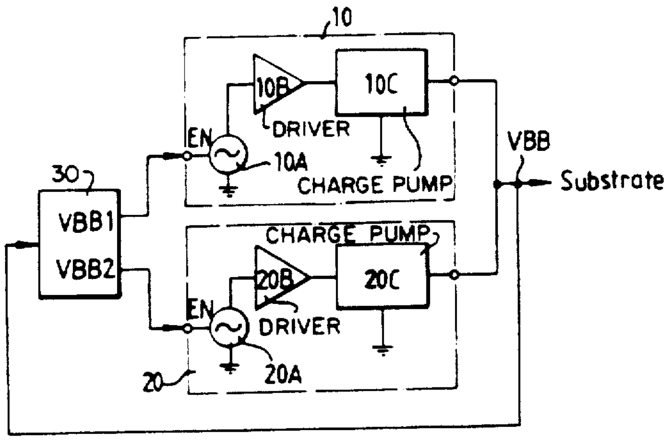

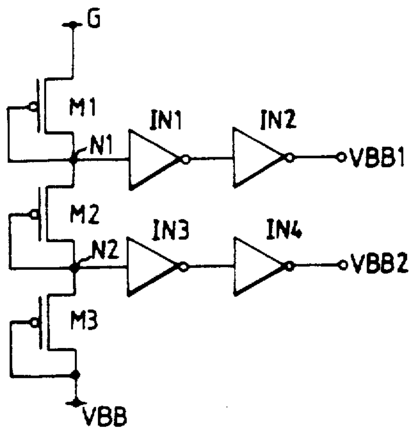

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-16 are cancelled.

* * * * *